United States Patent
Hwu et al.

(10) Patent No.: US 8,253,330 B2
(45) Date of Patent: Aug. 28, 2012

(54) AIRTIGHT MULTI-LAYER ARRAY TYPE LED

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 135 days.

(21) Appl. No.: 12/957,378

(22) Filed: Nov. 30, 2010

(65) Prior Publication Data

US 2012/0133268 A1    May 31, 2012

(51) Int. Cl.
*H01J 1/62*    (2006.01)

(52) U.S. Cl. ........ 313/512; 313/506; 362/374; 362/375; 257/99; 257/100

(58) Field of Classification Search ................... 313/489, 313/498, 501, 506–512; 362/364, 365, 368, 362/374, 375; 257/98–100
See application file for complete search history.

(56) References Cited

U.S. PATENT DOCUMENTS

| | | | |
|---|---|---|---|
| 2006/0102917 A1* | 5/2006 | Oyama et al. | 257/99 |
| 2007/0069219 A1* | 3/2007 | Lin et al. | 257/79 |
| 2008/0089072 A1* | 4/2008 | Kim et al. | 362/294 |
| 2008/0277685 A1* | 11/2008 | Kim et al. | 257/99 |
| 2009/0003003 A1* | 1/2009 | Park | 362/373 |

FOREIGN PATENT DOCUMENTS

TW        M387375        8/2010

* cited by examiner

*Primary Examiner* — Bumsuk Won
(74) *Attorney, Agent, or Firm* — Lin & Associates IP, Inc.

(57) ABSTRACT

An airtight multi-layer array type LED is disclosed, which comprises a metal substrate with an airtight metal frame formed thereon, and the metal substrate is integrally formed with the airtight metal frame, and an airtight sealing frame slot is formed around the upper surface of the airtight metal frame, the airtight metal frame is installed with two sets of sealing through hole pairs accommodating the lead frames. The interior of the airtight metal frame can be installed with packaging materials or optical components. The sealing holes are sealed with a glass or ceramic material. A fluorescent layer is formed on a silica gel layer, wherein the fluorescent layer can also be installed inside a silica glass package cover. The silica glass package cover is installed on the top surface of the airtight metal frame, and the silica glass package cover is engaged and sealed to a sealing rack. Nitrogen is filled in a space defined between the silica glass package cover and the fluorescent layer, so that moisture is prevented from permeating through the airtight metal frame and a dice protection layer. As such, a sealed-type LED packaging structure is formed and is suitable to be used in extreme or severe environments.

11 Claims, 6 Drawing Sheets ical discharging, heat and light-emitting of an incandescent light tube. Because light is emitted when electric current forward flowed across the PN junction of a semiconductor, LED is also called cold light. LED has features of durability, long service life, light-weight, low power consumption, and being free of toxic mercury, and thereby it can be widely used in the industry of luminance equipment, and LEDs are often arranged in an array and often used in such as electric bulletin board or traffic sign.

AIRTIGHT MULTI-LAYER ARRAY TYPE LED

BACKGROUND OF THE INVENTION

1. Field of the Invention

The present invention relates to a multi-layer array type LED, and particularly relates to a high-strength airtight multi-layer array type LED capable of completely preventing moisture from permeating through to it, and being durable in use and capable of keeping the performance of optical devices for a long term.

2. The Prior Arts

The light-emitting theory of LED takes advantage of the intrinsic properties of semiconductors, which is different from the theory of electric discharging, heat and light-emitting of an incandescent light tube. Because light is emitted when electric current forward flowed across the PN junction of a semiconductor, LED is also called cold light. LED has features of durability, long service life, light-weight, low power consumption, and being free of toxic mercury, and thereby it can be widely used in the industry of luminance equipment, and LEDs are often arranged in an array and often used in such as electric bulletin board or traffic sign.

Referring to Taiwan Utility Patent No. M387375, which disclosed a multi-layer array type LED packaging structure, mainly includes a metal substrate, a package module, a lead frame, and a package cover. The metal substrate is positioned at the bottom of the packaging structure, and the package module is used for integrating the metal substrate with the lead frame. The LED dices are arranged in an array form on the metal substrate. The LED dices are electrically connected to the lead frame. The package cover covers the package module.

However, the conventional LED cannot be used in moisture and high humidity environments, such as deep sea, air space, or military. This is because each layer of the packaging structure is not completely air-tightly connected to each other, the airtightness is thereof gradually deteriorated, the moisture in the interior is increased, and each component of the packaging structure may be separated from each other, or may even be burned down and damaged. As a result, the conventional packaging structure can not be used in a moist environment, and the structural strength may also be gradually weakened. Therefore, the LEDs that have just been installed will need to be replaced after a short period of time. Maintenance and installation operations have to be performed every now and then in severe environment, and thereby time and labor are wasted and personnel safety is threatened. In view of the above-mentioned disadvantages, a LED packaging structure, which is capable of completely preventing moisture from permeating through it, being durable in use and keeping the performance of optical devices for a long term, shall be provided.

BRIEF DESCRIPTION OF THE DRAWINGS

The present invention will be apparent to those skilled in the art by reading the following detailed description of a preferred embodiment thereof, with reference to the attached drawings, in which.

SUMMARY OF THE INVENTION

Figure 1:
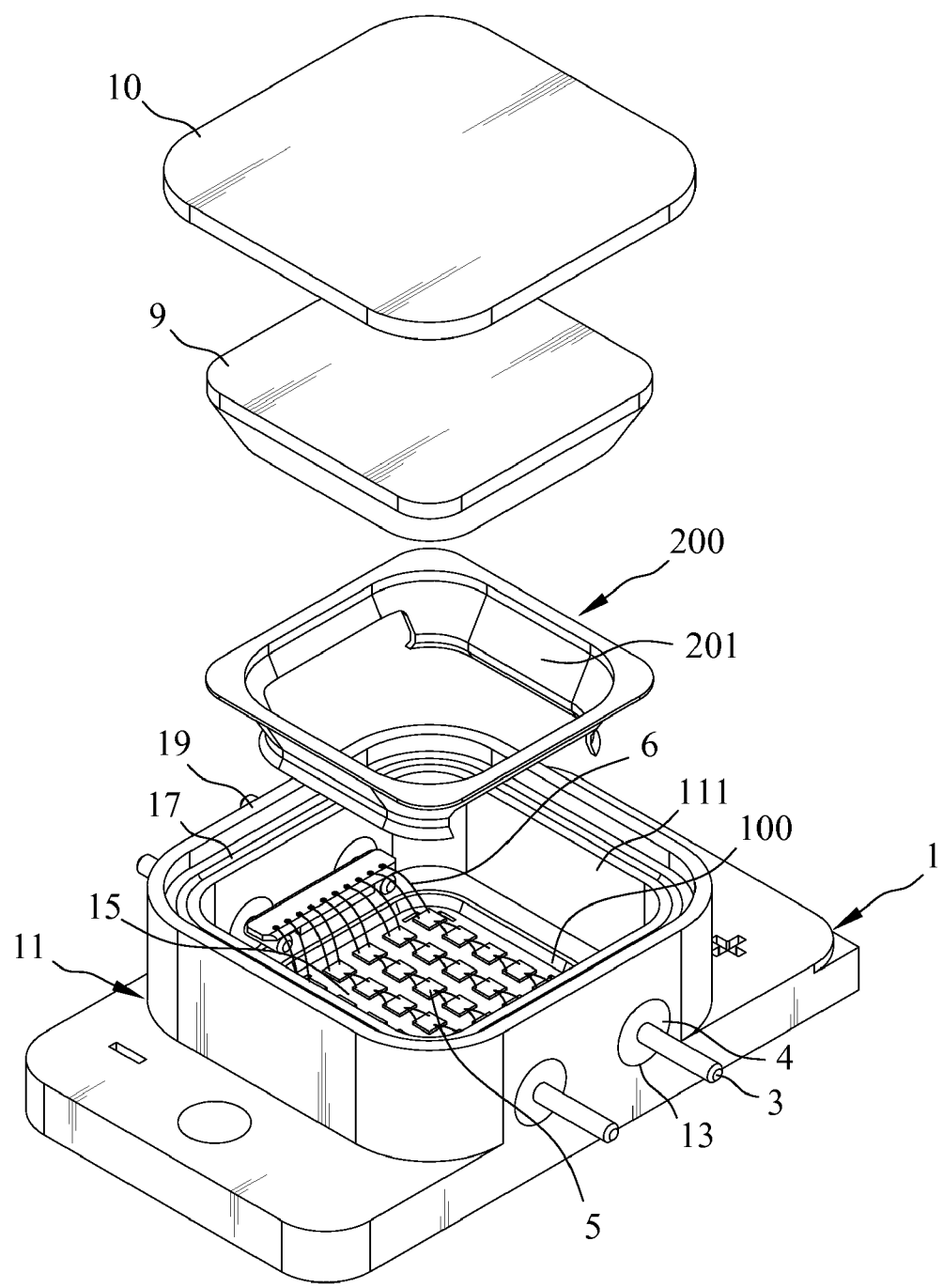
FIG. 1 is an exploded perspective view of an airtight multi-layer array type LED according to the present invention.

The objective of the present invention is to provide an airtight multi-layer array type LED in which the connection strength is high and the airtightness is excellent, and thereby such an array type LED is suitable to be used in a moist environment such as underwater. The metal substrate of the present invention is integrally formed, so that the whole structural strength is strong enough to work in extreme environments. The service life of optical components is prolonged, and the performance of optical components is prevented from deteriorating.

In order to achieve the above-mentioned objective, an airtight multi-layer array type LED provided by the present invention comprises a metal substrate, and two lead frames, and the metal substrate is integrally formed with the airtight metal frame surrounding an accommodating space filled with nitrogen, and an airtight sealing frame slot is formed around the upper surface of the airtight metal frame, and an outer edge of a top surface of the airtight metal frame is upwardly and vertical extended with a sealing rack, and the airtight metal frame is installed with two sets of sealing through hole pairs, and each lead frame consists of a connection board and a guide rod pair, and each set of the sealing through hole pairs is served to accommodate one guide rod pair, and the inner ends of the guide rod pair is connected with a connection board, and the outer ends of the guide rod pair is connected to a power source, and LED dices are installed on the bottom surface of the light output slot, wherein each of the LED dices is electrically connected to each other through wire bonding, and is electrically connected to the connection boards through a plurality of wires, and a dice protection layer is formed on the LED dices, and a fluorescent layer is formed on the dice protection layer, and a silica gel layer is formed on the fluorescent layer for protecting the fluorescent layer, and all interstitial space in the two sets of sealing through hole pairs is completely sealed with a sealing material, and a silica glass package cover is installed on the airtight metal frame, and the silica glass package cover is engaged and sealed to the sealing rack, and a space defined between the silica gel layer and the silica glass package cover is filled with nitrogen.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Recently, the light emitting diodes (LEDs) are widely applied in various environments including deep sea, air space, and even military. If LEDs are desired to be operated in environments with the conditions of high pressure, huge impact forces, high humidity or rapid temperature variation, the airtightness for packaging structure has to be enhanced for being stably operated in the severe environments for a long term. The multi-layer array type LED provided by the present invention is a multi-layer array type LED with an airtight packaging structure.

Figure 2:
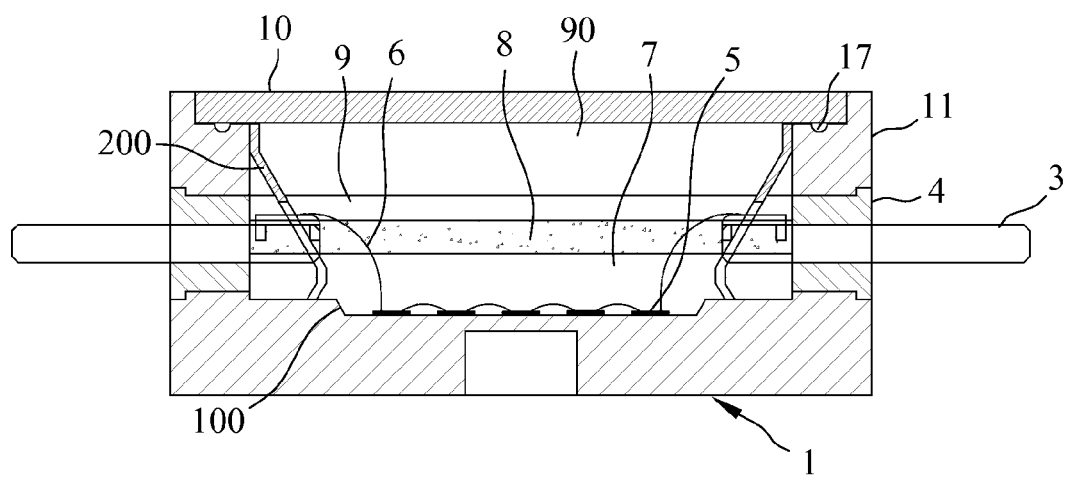
FIG. 2 is a schematic cross sectional view of the airtight multi-layer array type LED of the present invention.

Referring to FIG. 1, which is an exploded perspective view of the airtight multi-layer array type LED of the present invention; referring to FIG. 2, which is a schematic cross sectional view of the airtight multi-layer array type LED of the present invention. The present invention relates to an airtight multi-layer array type LED which comprises a metal substrate 1, two lead frames 3, a plurality of LED dices 5. The metal substrate 1 is formed with an airtight metal frame 11 surrounding an accommodating space 111. The metal substrate 1 is integrally formed with the airtight metal frame 11, and nitrogen 90 is provided in the accommodating space 111. The interior of the airtight metal frame 11 is able to package a plurality of optical units, optical components or packaging materials, etc. The metal substrate 1 can be formed by casting or tooling. The material of the metal substrate 1 can be aluminum, copper, copper ally or other metal materials having good heat conductivity so that heat is able to be rapidly and efficiently dissipated.

The inner wall of the airtight metal frame 11 can be further coated with a light-reflecting protection layer (not shown in drawing) for increasing the light reflectivity and enhancing the resistance to the environmental pressures. The material of the light-reflecting protection layer can be silver (Ag), nickel (Ni) or any metal materials having good light reflectivity. The airtight metal frame 11 is installed with two sets of the sealing through hole pairs 13. A light output slot 15 can be formed at the bottom of the airtight metal frame 11. The sidewall of the light output slot 15 has a light-reflecting oblique surface, and an intersection angle is defined between the light-reflecting oblique surface and the bottom surface of the light output slot 15. It is noted that in this embodiment, although the two sets of the sealing through hole pairs 13 are respectively installed on two opposite sides of the sidewall of the airtight metal frame 11, the arrangement of the sealing through hole pairs 13 is determined with respect to the actual needs, the arrangement disclosed in this embodiment is illustrated by way of example and not by way of limitation and the scope of the invention is defined by the appended claims which should be construed as broadly as the prior art will permit.

An airtight sealing frame slot 17 is formed around the upper surface of the airtight metal frame 11. The outer edge of the top surface of the airtight metal frame 11 is upwardly and vertical extended with a sealing rack 19. The sidewall of the light output slot 15 can be further laminated with a first light reflector 100. The first light reflector 100 receives light, and then reflects the received light. The interior of the airtight metal frame 11 can be further installed with a second light reflector 200 having a light-reflecting window panel 201. The exterior of the second light reflector 200 is abutted against the inner wall of the airtight metal frame 11. The light-reflecting window panel 201 of the second light reflector 200 receives light then reflects the received light.

Each lead frame 3 consists of a connection board 31 and a guide rod pair 33. Each set of the sealing through hole pairs 13 is served to accommodate each guide rod pair 33. The inner ends of the guide rod pair 33 are connected with the connection board 31, and the outer ends thereof are connected to a power source. All interstitial space in the two sets of sealing through hole pairs 13 are completely sealed with a sealing material 4, so that water is prevented from permeating through the two sets of sealing through hole pairs 13. The sealing material 4 can be a glass, ceramic, glass ceramic or other appropriate material. The sealing through hole pairs 13 are sealed with the sealing material 4 at high temperature, and after the sealing material 4 is cooled, it is solidified, and in this way, the complete sealing is achieved and no path is formed for moisture permeation.

The LED dices 5 are installed at the bottom of the accommodating space 111; or as shown in this embodiment, the LED dices 5 can also be installed on the bottom surface of the light output slot 15. When the LED dices 5 emit light, the emitted light can be reflected by the first light reflector 100 and the second light reflector 200, so that the light-emitting efficiency is effectively increased. The LED dices 5 are preferably arranged in an array manner, wherein each of the LED dice 5 is electrically connected to each other through wire bonding, and the LED dices 5 are electrically connected to the connection boards 31 through a plurality of wires 6 so as to form an electric circuit, and the outer ends of the guide rod pair 33 are connected to the power source.

A dice protection layer 7 is formed on the LED dice 5 for covering and protecting the LED dices 5 and the wires 6. A fluorescent layer 8 is formed on the dice protection layer 7. The fluorescent layer 8 is made of a phosphor or other suitable material. A silica gel layer 9 is formed on the fluorescent layer 8 for protecting the fluorescent layer 8. The silica gel layer 9 is covered on the fluorescent layer 8 by injection molding, or is directly formed on the dice protection layer 7 by injection molding.

The top surface of the airtight metal frame 11 is installed with a silica glass package cover 10. The silica glass package cover 10 is engaged with the sealing rack 19, wherein the silica glass package cover 10 and the sealing rack 19 can be engaged with each other by a laser engagement method, a thermal seal engagement method, a solder engagement method and a melting engagement method, or other suitable method. The silica glass package cover 10 can be in the shape of a plane, a concave or a convex hemisphere.

The accommodating space 111 of the airtight metal frame 11 is filled with nitrogen 90, thus eventually only the nitrogen 90 is kept in the space defined between the silica glass package cover 10 and the silica gel layer 9. As such, the LED dices 5, the dice protection layer 7, and the fluorescent layer 8 are all sealed in the dried nitrogen 90 atmosphere.

Because the accommodating space 111 is filled with dried nitrogen 90, the external moisture is not able to permeate into it, and the internal nitrogen 90 is used for preventing the generation of moisture due to the rapid change of temperature. Therefore, the fluorescent layer 8, the dice protection layer 7 and the LED dices 5 are prevented from deteriorating caused by the moisture, so that the airtight multi-layer array type LED of the present invention is suitable to be used in deep sea or an industrial environment with high humidity. Moreover, the airtight metal frame 11 is integrally formed with the metal substrate 1 so that the structural strength of the airtight multi-layer array type LED of the present invention is further reinforced, and thereby the airtight multi-layer array type LED of the present invention can be used in the air space or military environments where huge-impact forces and extreme-pressure may occur.

Figure 3:
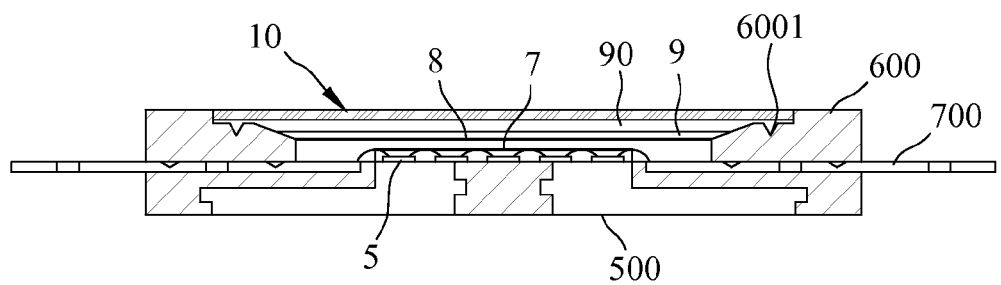
FIG. 3 is a schematic cross sectional view of the first embodiment of the present invention.

Referring to FIG. 3, which is a schematic cross sectional view of the first embodiment of the present invention. The airtight multi-layer array type LED in the first embodiment of the present invention mainly comprises a metal substrate 500, a package module 600 and a lead frame 700. The package module 600 is served to integrate the metal substrate 500 and the lead frame 700. The LED dices 5 are arranged in an array manner, and are installed on the metal substrate 500. The LED dices 5 are electrically connected to the lead frame 700. A dice protection layer 7 and a fluorescent layer 8 are in sequence formed on the LED dices 5. A silica gel layer 9 is formed on the fluorescent layer 8 for protecting the fluorescent layer 8 from deteriorating caused by the moisture. The inner wall of the package module 600 is installed with an airtight sealing frame slot 6001, and a silica glass package cover 10 is installed on the inner wall of the package module 600. The silica glass package cover 10 is engaged with the package module 600, and a space defined between the silica gel layer 9 and the silica glass package cover 10 is filled with nitrogen 90. In the first embodiment, it proves that the airtight multi-layer array type LED of the present invention can be applied to other packaging structures, so that a packaging structure, which is originally incapable of preventing the moisture from permeating through it, can be transformed to a packaging structure capable of being used in an environment with high humidity, and the problems of short circuits due to the deterioration of materials caused by the moisture can be avoided, and thereby the efficient operation of each optical component is ensured.

Figure 4:
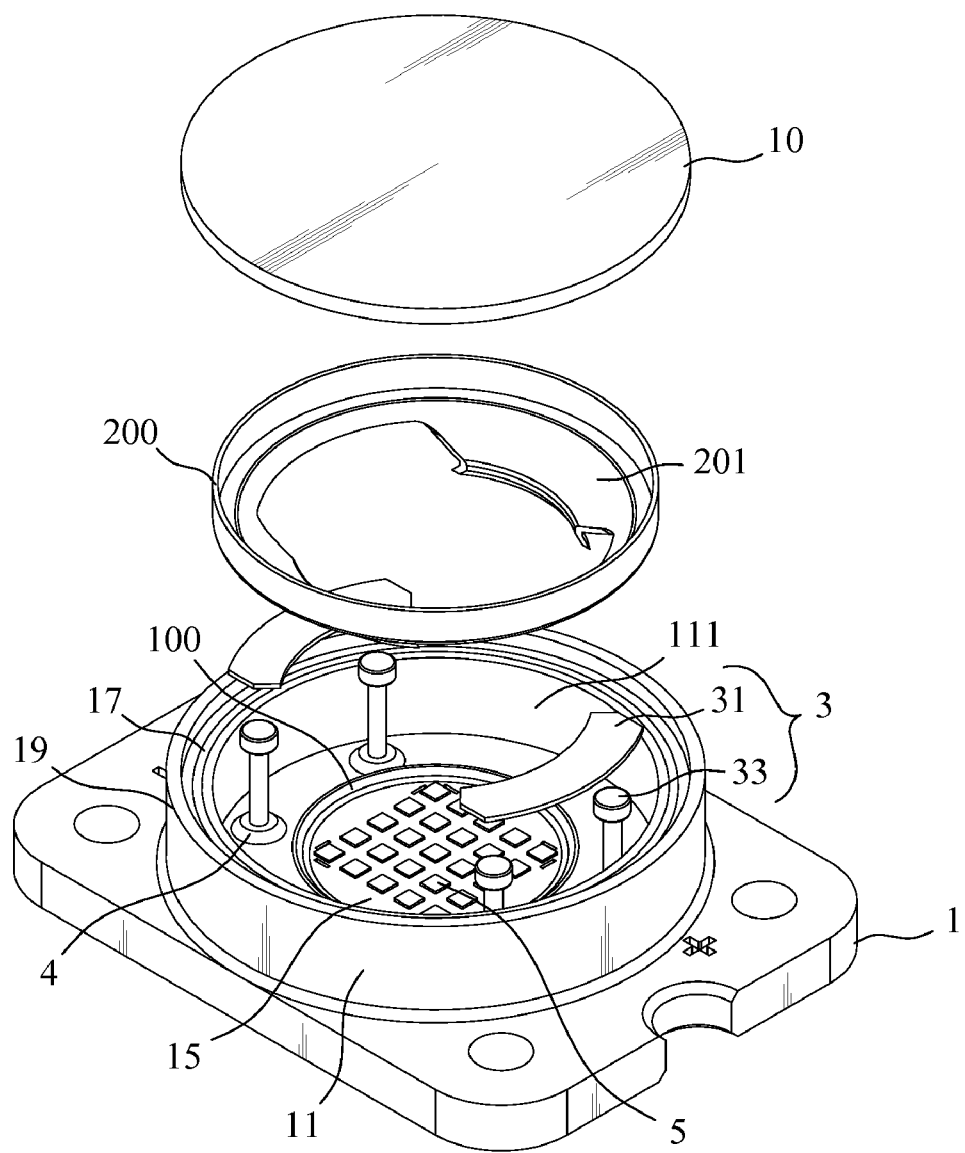
FIG. 4 is a schematic exploded view of the second embodiment of the present invention.
Figure 5:
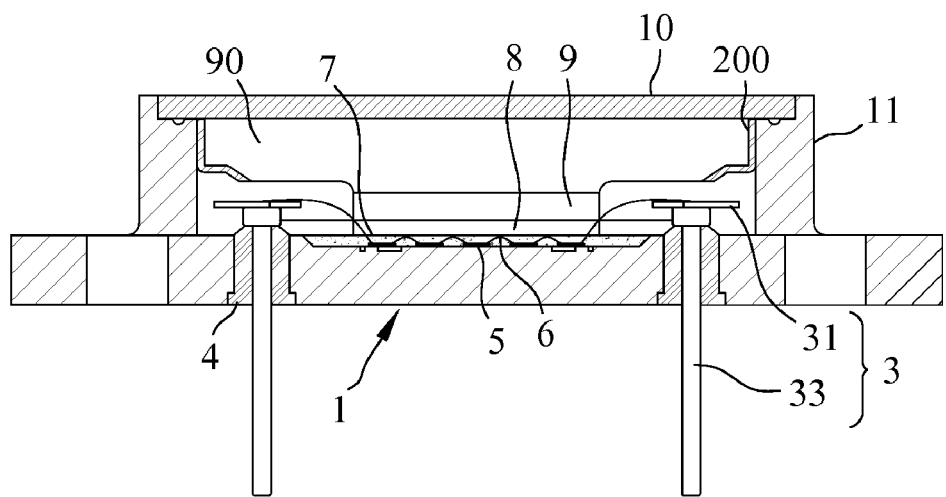
FIG. 5 is a schematic cross sectional view of the second embodiment of the present invention.
Figure 6:
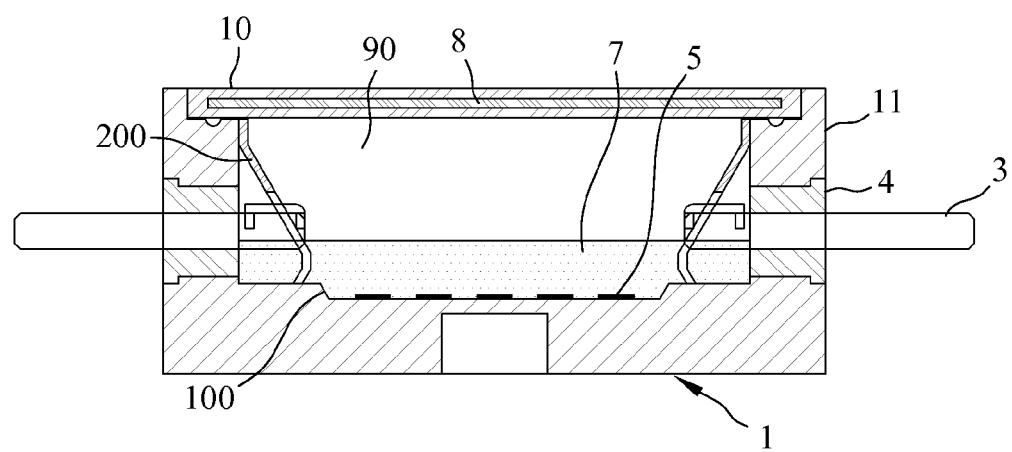
FIG. 6 is a schematic cross sectional view of the third embodiment of the present invention.

Referring to FIGS. 4-6, in the first embodiment of the present invention, the two sets of sealing through hole pairs 13 are respectively installed at the two different sites of the metal substrate 1 located at the bottom of the accommodating space 111. The two lead frames 3 are respectively installed in the two sets of sealing through hole pairs 13 through its own guide rod pair 33 in a vertical direction. All interstitial space in the two sets of sealing through hole pairs 13 are completely sealed with a sealing material 4. As shown in FIG. 6, the fluorescent layer 8 can be pre-set inside the silica glass package cover 10.

Because the interior of the packaging structure of the airtight multi-layer array type LED of the present invention is filled with nitrogen 90, the interior is completely dry, and thereby bubbles or moisture cannot form. In the packaging structure of the present invention, a completely-sealed space is formed, and thereby a completely airtight and high-strength structure is obtained, and the moisture is prevented from permeating through it, and the airtight multi-layer array type LED of the present invention is durable and allows the optical components to be operated at the best performance, and is very suitable to be used in the severe environments.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An airtight multi-layer array type LED, at least comprises a metal substrate, and two lead frames, the metal substrate being integrally formed with the airtight metal frame surrounding an accommodating space, nitrogen being filled in the accommodating space, an airtight sealing frame slot being formed around the upper surface of the airtight metal frame, an outer edge of a top surface of the airtight metal frame being upwardly and vertical extended with a sealing rack, the airtight metal frame being installed with two sets of sealing through hole pairs, each lead frame consisting of a connection board and a guide rod pair, each set of the sealing through hole pairs being served to accommodate one guide rod pair, inner ends of the guide rod pair being connected with a connection board, outer ends of the guide rod pair being connected to a power source, LED dices being installed on a bottom surface of the light output slot, each of the LED dices being electrically connected to each other through wire bonding, the LED dices being electrically connected to connection boards through a plurality of wires, a dice protection layer being formed on the LED dices, a fluorescent layer being formed on the dice protection layer, a silica gel layer being formed on the fluorescent layer for protecting the fluorescent layer, all interstitial space in the two sets of sealing through hole pairs being completely sealed with a sealing material, a silica glass package cover being installed on the airtight metal frame, the silica glass package cover being engaged and sealed to the sealing rack, and a space defined between the silica gel layer and the silica glass package cover being filled with nitrogen.

2. The airtight multi-layer array type LED according to claim 1, wherein the airtight metal frame is integrally formed with the metal substrate.

3. The airtight multi-layer array type LED according to claim 1, wherein the material of the metal substrate is at least one of aluminum, copper, and copper alloy.

4. The airtight multi-layer array type LED according to claim 1, wherein an inner wall of the airtight metal frame is further coated with a light-reflecting protection layer; the material of the light-reflecting protection layer is at least one of silver and nickel.

5. The airtight multi-layer array type LED according to claim 1, wherein the sealing material is at least one of glass, ceramic and glass ceramic.

6. The airtight multi-layer array type LED according to claim 1, wherein a light output slot is formed at a bottom of the airtight metal frame, the LED dices are installed on a bottom surface of the light output slot, and a sidewall of the light output slot is further installed with a first light reflector.

7. The airtight multi-layer array type LED according to claim 1, wherein an interior of the airtight metal frame is further installed with a second light reflector having a light-reflecting window panel, and an exterior of the second light reflector is abutted against an inner wall of the airtight metal frame, and the light-reflecting window panel of the second light reflector receives light then reflects the received light.

8. The airtight multi-layer array type LED according to claim 1, wherein the silica glass package cover is in a shape of a plane, a concave or a convex hemispheres.

9. The airtight multi-layer array type LED according to claim 1, wherein the silica glass package cover and the sealing rack is engaged with each other by at least one of a laser engagement method, a thermal seal engagement method, a solder engagement method, and a melting engagement method.

10. The airtight multi-layer array type LED according to claim 1, wherein the fluorescent layer is pre-set inside the silica glass package cover.

11. The airtight multi-layer array type LED according to claim 1, wherein the fluorescent layer is made of a phosphor.

* * * * *